United States Patent [19]

Eriksson et al.

[11] Patent Number: 5,446,387

[45] Date of Patent: Aug. 29, 1995

[54] METHOD AND A DEVICE FOR DETERMINING A FAULT ON A TRANSMISSION LINE

[75] Inventors: Leif Eriksson, Sala; Murari M. Saha, Västeras, both of Sweden

[73] Assignee: Asea Brown Boveri AB, Vasteras, Sweden

[21] Appl. No.: 124,034

[22] Filed: Sep. 21, 1993

[30] Foreign Application Priority Data

Oct. 20, 1992 [SE] Sweden ................................ 9203071

[51] Int. Cl.⁶ .............................................. G01R 31/08
[52] U.S. Cl. ...................................... 324/522; 324/539; 361/80
[58] Field of Search ............... 324/509, 521, 522, 539, 324/541, 543, 544, 551; 361/79, 80

[56] References Cited

U.S. PATENT DOCUMENTS

| | | |
|---|---|---|
| 4,251,766 | 2/1981 | Souillard ........................ 324/521 |
| 4,499,417 | 2/1985 | Wright et al. .................. 324/522 X |
| 4,559,491 | 12/1985 | Sara ................................ 324/522 |
| 4,868,704 | 9/1989 | Cavero ........................... 324/522 X |
| 4,906,937 | 3/1989 | Wikstrom et al. .............. 324/522 |

FOREIGN PATENT DOCUMENTS 92019728 6/1992 Sweden .

OTHER PUBLICATIONS

Numerical Distance Protection for Sub-Transmission Lines; Engovist et al.; International Conference on Large High Voltage Electric Systems; 1988; No. 34-04.
Computer Relaying; IEEE Tutorial Course, 79 EH01-48-7 PWR; pp. 22 & 74.
Micro-Processor-Based Algorithm for High-Resistance Earth-Fault Distance Protection; Yang et al.; IEE Proceedings; vol. 130 Pt. C No. 6; Nov. 1983; pp. 307-310.

Primary Examiner—Kenneth A. Wieder
Assistant Examiner—Diep Do
Attorney, Agent, or Firm—Watson Cole Grindle & Watson

[57] ABSTRACT

A method and a device for determining the distance from a measuring station to a fault on a transmission line based on a fault model of a transmission network while taking into consideration the zero-sequence impedance and, where assuming a fault current, while taking into consideration the feeding of fault current to the fault point from both ends of the transmission line (FIG. 3).

18 Claims, 2 Drawing Sheets

METHOD AND A DEVICE FOR DETERMINING A FAULT ON A TRANSMISSION LINE

TECHNICAL FIELD

For protection of cables and overhead lines, so-called distance protections are used. These may be based on different technical principles, often starting from a certain region of function in an impedance plane or in the form of a wave detector-based design. In this connection it is normally desired to find out the distance from a measuring station to a fault and also to be able to determine the magnitude of the fault resistance. The present invention comprises a method and a device for determining the distance to a fault from a measuring station and the magnitude of the fault resistance.

BACKGROUND ART, THE PROBLEMS

The principles of fault location and determination of fault resistance in the event of a fault on a protected line distance are known from a number of publications, of which some will be described in the following. The basic material consist of measured values obtained with the aid of instrument transformers for voltage and current in a measuring station near the protected line. These measured values are applied to a model of the network in question, the model being built into the distance protection. Current technique comprises analog-to-digital (A/D) conversion and filtering of the measured values which then, via different distance protection equations for the model, determine the distance to the fault and the magnitude of the fault resistance.

U.S. Pat. No. 4,906,937 describes a method which is based on a network configuration according to FIG. 1. The faultless line impedance $Z_{PQ}$ of the protected line distance between two measuring stations P and Q is sensed. After a fault has been determined, the voltages $U_P$ and $U_Q$ and the currents $I_P$ and $I_Q$ can be measured in the respective stations. The voltages and the currents can belong to anyone of the phases R, S and T. Normally, however, in order to avoid communication between the stations, the starting-point are measured values at one of the stations. If in accordance with FIG. 1, the assumption is made that a current $I_F$ flows through a fault resistance $R_F$, whereby a voltage $U_F$ is applied across the fault resistance, the following voltage balance equation for the network can be set up:

$$U_P = U_{PF} + U_F = \alpha \cdot Z_{PQ} I_P + R_F I_F \qquad (1)$$

Here, $\alpha = 0-1$ is a measure of the fault location assumed for the time being. Equation (1) cannot be directly solved because of too many unknown parameters and it is therefore necessary to make certain assumptions and use special methods for solution, for example in the form of linear regression, to be able to solve it.

In an article in IEEE Tutorial Course: "Computer relaying", 79 EH 0148-7-PWR, page 22, equation (18), the assumption is made that the protected line can be described as an R-L series circuit. The voltage balance equation (18), with designations from this article, has the following form:

$$V = R_{eff} i + L_{eff} di/dt \qquad (2)$$

where $R_{eff}$ relates to the sum of the line resistance up to the fault point plus the fault resistance and $L_{eff}$ relates to the line inductance from the measuring station and up to the fault point.

Figure 2:
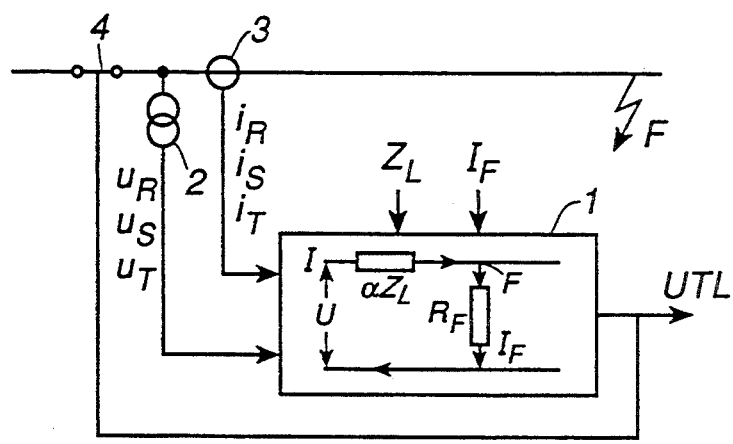
FIG. 2 shows how a distance protection with a fault model according to the state of the art is connected to the transmission network according to FIG. 1.

The above two modes of representation of a transmission network and the equations which can be derived therefrom are used as distance protection equations and form the direct basis of the fault model according to FIG. 2 which is arranged in existing distance protections. FIG. 2 shows, in principle, how the distance protection 1 with the fault model in question, in addition to being supplied with information about the data of the network and an assumption about the fault current via instrument transformers 2 and 3 for voltage and current, is also continuously supplied with all the phase currents and phase voltages, which values are filtered and signal-processed. Because of the transformation of the measurement signals, the line impedance $Z_{PQ}$ is replaced by a transformed line impedance $Z_L$ in the fault model. Tripping of the circuit breaker 4 for disconnection of the network takes place when specified criteria built into the distance protection are fulfilled.

In an article entitled "Microprocessor-based algorithm for high-resistance earth fault distance protection", by Q. S. Yang et al in IEE Proc., Vol. 139, Pt.C., No. 6, Nov. 1983, a voltage balance equation for a network is described, starting from a simplified network configuration where capacitive powers have been omitted. The article makes the assumption that the fault current is equal to the current change which takes place between the current during one cycle before the occurrence of a fault and the current after the occurrence of the fault. The voltage balance equations are evaluated with respect to the distance to the fault, starting from measured values from the power network at two adjacent points in time and based on known network data. The method described requires relative extensive resources to be able to save measured currents before the occurrence of a fault and difficulties also arise when these current values are to be matched together with currents measured during the fault. These difficulties are also amplified if the frequency of the network deviates from the nominal one. Since the calculations are based solely on measured values taken at two adjacent points in time, the accuracy is limited where the derivative of the current is small, that is, at the peak of the current curve. The article therefore recommends that the calculations be performed with measured values taken close to the zero crossing of the current.

The assumption of a fault current according to the state of the art, as is also clear from the above, is based on feeding the fault current $I_F$ to the fault point only via the station where the measurement takes place, that is, only from one end of the line. This results in a fault source since feeding of fault current to the fault point from the other end of the line is not taken into consideration.

In an article entitled "Numerical distance protection for sub-transmission lines" by A. Engqvist, L. Eriksson, Cigré, 34-04, 1988, a technique is described which shows how measured sampled phase currents and phase voltages are processed in various filters to be subsequently used in the fault models used. The filters comprise, inter alia, low-pass filters and recursively operating Fourier filters. The filter technique described also means that unwanted harmonic signals are eliminated as well as an orthogonal processing of the measurement signals for a division thereof into real and imaginary parts.

SUMMARY OF THE INVENTION

The invention relates to a distance protection and comprises a method and a device for determining the distance from a measuring station to a fault on a transmission line. The invention is clear from FIG. 3 and is based on a fault model of a transmission network in which, in contrast to prior art fault models, the zero-sequence impedance has been taken into consideration. The fault model according to the invention will therefore be described below as an extended fault model. In the same way as the transformed line impedance $Z_L$, the zero-sequence impedance consists of a transformed zero-sequence impedance and is here designated $Z_N$. With these designations, the voltage balance equation (1) according to the above for the extended fault model will be written as $$U = \alpha(Z_L I + Z_N I_N) + I_F R_F \quad (3)$$

where I is the transformed phase current and $I_N$ the transformed zero-sequence current. If the impedances are replaced by their respective resistances and inductances, that is, where the transformed line impedance $Z_L$ is replaced by the transformed line resistance $R_L$ and the transformed line inductance $L_L$ and where the transformed zero-sequence impedance $Z_N$ is replaced by the transformed zero-sequence resistance $R_N$ and the transformed zero-sequence inductance $L_N$, the voltage balance equation (3) for each phase will have the following form $$U = \alpha(R_L I + L_L dI/dt + R_N I_N + L_N dI_N/dt) + I_F R_F \quad (4)$$

If the inductance of the line is expressed by means of the reactance $X_L$ of the line at the network frequency in question, $\omega_0$, that is.

$$L_L = X_L/\omega_0$$

and, in a corresponding way, if the zero-sequence inductance is expressed by means of the zero-sequence reactance $X_N$ at the network frequency in question, $\omega_0$, that is, $$L_N = X_N/\omega_0$$

while at the same time setting dI at $$dI = I_1 - I_0$$

that is, the difference between two consecutive sample values of the current I while at the same time setting $dI_N$ at $$dI_N = I_{N1} - I_{N0}$$

that is, the difference between two consecutive sample values of the zero-sequence current and defining "dt" as the time between two consecutive sample values, which also means that ($\omega_0 dt$) corresponds to the angle between two consecutive samples, then the voltage balance equation (4) can be written as $$U = \alpha(R_L I + X_L(I_1 - I_0)/(\omega_0 dt) + R_N I_N + X_N(I_{N1} - I_{N0})/(\omega_0 dt)) + I_F R_F \quad (5)$$

The voltage balance equation (3) comprises three different currents, namely, I, $I_N$ and $I_F$. Of these, I is directly measurable, the zero-sequence current $I_N$ can be obtained, inter alia, as the sum of all the phase currents, whereas for the fault current $I_F$ an assumption has to be made.

In contrast to the state of the art, according to the present invention, when assuming a fault current, feeding of fault current to the fault point from both ends of the line is also taken into consideration. One way of achieving this is described in Swedish patent application 92019728 entitled "Fault current filter" This shows that a measure of the fault current can be obtained by summing the measured current samples for each phase at two adjacent points in time, the value of each current sample being multiplied by a respective coefficient which is chosen such that the fault current gets into phase with the positive-sequence and negative-sequence current changes.

Figure 3:
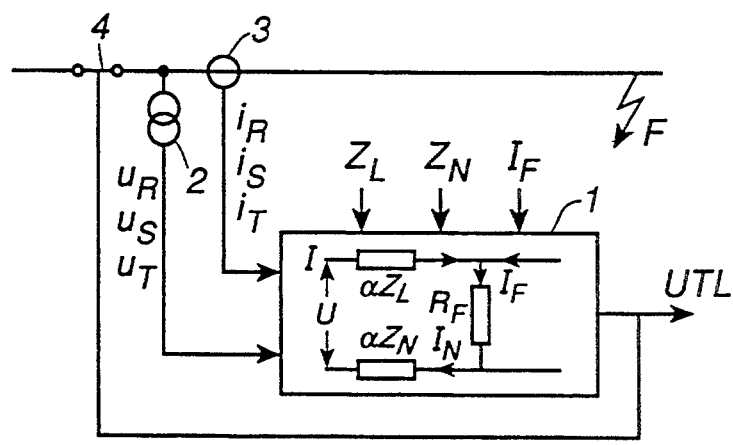
FIG. 3 shows how a distance protection with a fault model according to the invention is connected to a transmission network.

If calculations are to be carried out on an extended fault model according to FIG. 3 starting from corresponding voltage balance equations to obtain a measure of "$\alpha$" and $R_F$, it is also necessary to have access to calculated values of the transformed line impedance $Z_L$ and the zero-sequence impedance $Z_N$ with their respective resistive and inductive components.

To obtain a measure of "$\alpha$" and $R_F$, any of voltage balance equation (4) or (5) can be made the starting-point, as shown above. However, this presupposes access to the derivatives of both I and $I_N$. The derivatives can either be obtained by pure differentiation or with the aid of the current difference between two consecutive sample values, that is as shown in equation (5).

Thus, besides having access to the parameters $Z_L$ and $Z_N$ of the extended fault model, access is also had to six of the remaining eight varying signal parameters in the equation, namely, U, I, $I_N$ and hence also dI/dt and $dI_N/dt$ and the fault current $I_F$. To be able to solve the parameters "$\alpha$" and $R_F$, according to the invention the possibility of orthogonal processing, as mentioned above, is made use of. By this processing, that is, obtaining the real part and the imaginary part of the signal parameters, for each measurement two voltage balance equations (4r) and (4i) can be set up as follows, where the index "r" indicates the respective real part and the index "i" indicates the respective imaginary part:

$$U_r = \alpha(R_L I_r + L_L dI_r/dt + R_N I_{Nr} + L_N dI_{Nr}/dt) + I_{Fr} R_F \quad (4r)$$

$$U_i = \alpha(R_L I_i + L_L dI_i/dt + R_N I_{Ni} + L_N dI_{Ni}/dt) + I_{Fi} R_F \quad (4i)$$

Without going into any intermediate calculations, it can be shown that "$\alpha$", that is, the relative distance from the measuring station to the fault F, can be written as $$\alpha = (U_r I_{Fi} - U_i I_{Fr})/(U_{Hr} I_{Fi} - U_{Hi} I_{Fr}) \quad (6)$$

where $$U_{Hr} = k_1 \cdot I_r + k_2 \cdot I_{Nr} + k_3 \cdot dI_r + k_4 \cdot dI_{Nr} \quad (7)$$

$$U_{Hi} = k_1 \cdot I_i + k_2 \cdot I_{Ni} + k_3 \cdot dI_i + k_4 \cdot dI_{Ni} \quad (8)$$

the coefficients $k_1$, $k_2$, $k_3$ and $k_4$ being capable of being determined with the aid of the parameters $R_L$, $L_L$, $R_N$ and $L_N$ of the extended fault model according to the following:

$$k_1 = R_L, \ k_2 = R_N, \ k_3 = X_L/\omega_0 dt = L_L/dt,$$
$$k_4 = X_N/\omega_0 dt = L_N/dt$$

From the voltage balance equations (4r) and (4i) a value of the fault resistance $R_F$ can be obtained in a corresponding way. In practice, however, this value is of no interest since the criteria for solution of a transmission network, in addition to controlling whether the value of "$\alpha$" lies between 0 and 1, is normally based on a control whether $$|Z| = |U_A/I_A| < Z_{in}$$

that is, via a normal underimpedance relay with a setting $Z_{in}$ lower than the normal load impedance.

Figure 1:
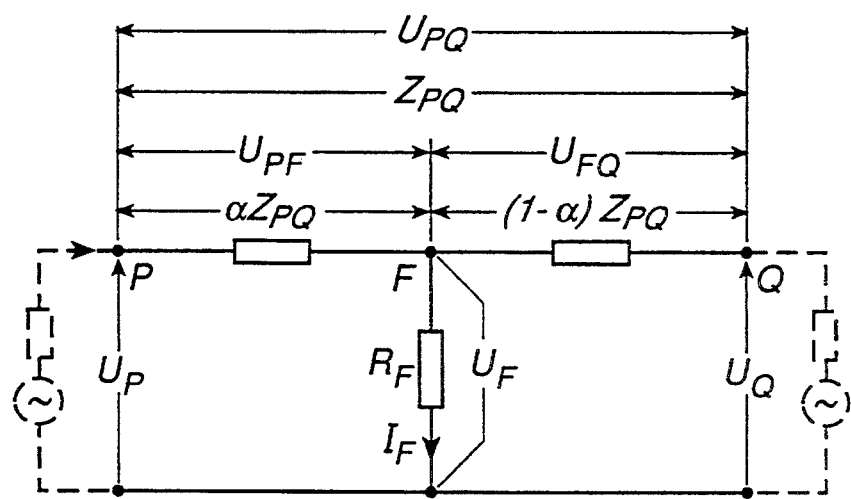
FIG. 1 shows a transmission line between the stations P and Q, on which a fault on any of the phases to ground has occurred at F. Otherwise, the figure comprises the voltages, currents, impedances, etc. which are mentioned in the following description.
Figure 4:
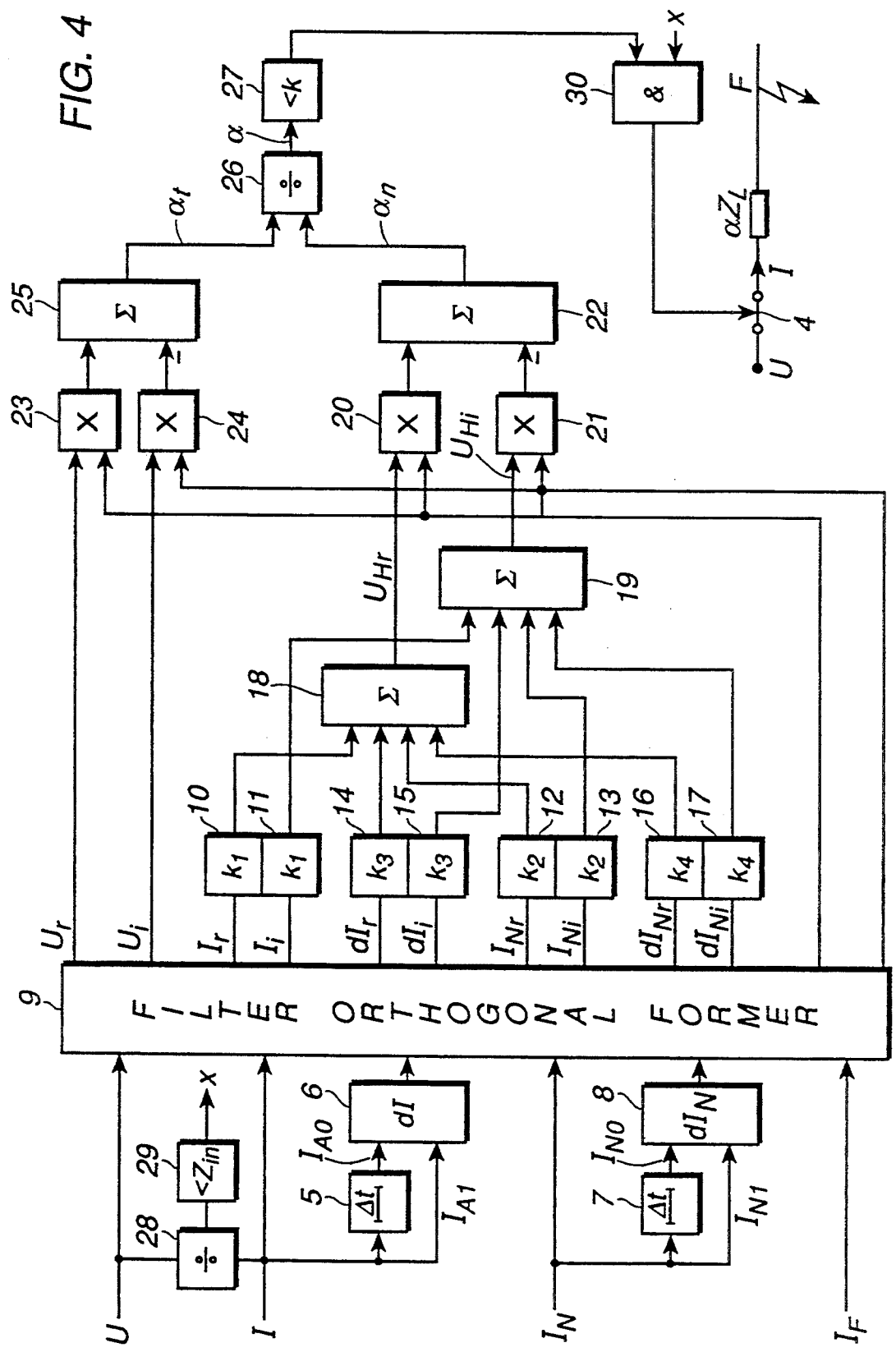
FIG. 4 shows a device for fault determination according to the invention.

The connection of the distance protection to the transmission network takes place in the same way as for the transmission network according to FIG. 1 and is clear from FIG. 4, where the equivalent diagram of the extended fault model used is shown. The extended fault model is described by a distance protection equation which is based on any of the previously described equations, where the zero-sequence impedance has been taken into consideration. In addition, when assuming a fault current, feeding of the fault current to the fault point from both ends of the line has been taken into consideration. The signal processing and the method of calculation for obtaining the basic data for the criteria for tripping of the line are based on the same filtering and orthogonal processing of the measurement signals as are mentioned in the above-mentioned Cigré report.

DESCRIPTION OF THE PREFERRED EMBODIMENTS

A device for carrying out the method for obtaining a relative measure "$\alpha$" of the distance from a measuring station to a fault on a transmission line with the aid of an extended fault model according to FIG. 3 is clear from FIG. 4. The device is a realization of the voltage balance equations, obtained under the "Summary of the invention" above, which are based on the voltage balance equations (4r), (4i), (7) and (8). The device according to FIG. 4 illustrates an embodiment for one of the phases, the current I and the voltage U of which may belong to any one of the phases R, S and T. Further, it is assumed that all the phase currents are available to be able to obtain a measure of the zero-sequence current $I_N$ which arises upon a fault on the transmission network, and that a fault current $I_F$ obtained with the aid of the above-mentioned fault current filter is available. All the input signals consist of sampled numerical values. As before, designations indexed "0" and "1" relate to two consecutive sample values. In addition, known values of the impedance of the transmission network and the zero-sequence impedance with their respective resistance and reactance parts are made the starting-point, to be able to choose suitable settings of the fault model.

Thus, in a distance protection according to the invention, a device according to FIG. 4 is arranged for each phase. The device is continuously supplied with measured values or values of the phase voltage U, the phase current I, the zero-sequence current $I_N$ and the fault current $I_F$ obtained in some other way. As will be clear from the above equations, information about the derivatives of both the phase currents and the zero-sequence current is needed. According to the state of the art, a number of different methods are available to obtain a measure of these derivatives. FIG. 4 indicates a method which relates to the voltage balance equation (5), that is, that a measure of the derivatives is obtained with the aid of two consecutive sample values. As far as the phase current is concerned, this takes place via the time-lag element 5 and the dI-generator 6 and as far as the zero-sequence current is concerned, this takes place with the time-lag element 7 and the $d_{iN}$-generator 8.

As stated under the background art, it is known, inter alia, from the Cigré report 34-04, 1988, by A. Engqvist and L. Eriksson how sampled measured values can be filtered and processed such that the measurement signals can be divided into their respective real and imaginary parts. All six of the above-mentioned available sampled signals are now supplied to a "filter and orthogonal generator unit" 9 for filtering and processing to obtain the real and imaginary parts of these signals, whereby access will be had to values of $U_r$, $U_i$, $I_r$, $I_i$, $dI_r$, $dI_i$, $I_{Nr}$, $I_{Ni}$, $dI_{Nr}$, $dI_{Ni}$, $I_{Fr}$ and $I_{Fi}$. This means that together with known data for the transmission network, all the necessary parameters for determining the relative distance to the fault, "$\alpha$", are available.

As will be clear from the above summary of the invention, the coefficients $k_1$, $k_2$, $k_3$ and $k_4$ can be determined with the aid of the parameters $R_L$, $L_L$, $R_N$ and $L_N$ of the transmission network. By placing $k_1$ in the coefficient units 10 and 11, $k_2$ in the coefficient units 12 and 13, $k_3$ in the coefficient units 14 and 15 and $k_4$ in the coefficient units 16 and 17, in accordance with equation (7) the quantity $U_{Hr}$ can be determined via a first summator 18 which is composed of $k_1 \cdot I_r$, $k_2 \cdot I_{Nr}$, $k_3 \cdot dI_r$ and $k_4 \cdot dI_{Nr}$, and, in a corresponding way, according to equation (8) the quantity $U_{Hi}$ can be determined via a second summator 19 which is composed of $k_1 \cdot I_i$, $k_2 \cdot I_{Ni}$, $k_3 \cdot dI_i$ and $k_4 \cdot dI_{Ni}$. Then, by multiplying $U_{Hr}$ in a first multiplier 20 by the imaginary part of the fault current, that is $I_{Fi}$, for forming a first product $U_{Hr} \cdot I_{Fi}$ and multiplying $U_{Hi}$ in a second multiplier 21 by the real part of the fault current, that is $I_{Fr}$, for forming a second product $U_{Hi} \cdot I_{Fr}$ and thereafter, in a difference generator 22, forming the difference between the first and second products, a value of the denominator $\alpha_n$ in equation (6) is formed. By multiplying in a third multiplier 23 the real part $U_r$ of the phase voltage by the imaginary part of the fault current, that is $I_{Fi}$, for forming a third product $U_r \cdot I_{Fi}$ and multiplying in a fourth multiplier 24 the imaginary part $U_i$ of the phase voltage by the real part of the phase current, that is $I_{Fr}$, for forming a fourth product $U_i \cdot I_{Fr}$, and then in a difference generator 25 forming the difference between the third and fourth products, a value of the numerator $\alpha_t$ in equation (6) is formed. With values of $\alpha_t$ and $\alpha_n$ thus obtained, a measure of the relative distance from the measuring station P to the fault F can be obtained via a first quotient generator 26.

FIG. 4 also shows the conditions, of a more practical nature, for the fault resulting in tripping of the circuit breaker 3. A first criterion for the fault being interpreted as a fault on the line between P and Q is that the value of "$\alpha$" obtained lies within the limits $0 < \alpha < 1$. In practice, however, the higher value is set at a value "k" somewhat lower than 1. The drawing-up of these limits can be performed with the aid of a first selector element 27.

As mentioned under the summary of the invention, it is normally assumed that at least two criteria should be fulfilled for the line or phase in question to be disconnected. The second criterion is often checked with the aid of a conventional underimpedance relay where, via a second quotient generator 28 with the aid of the phase voltage U and the phase current I, the impedance represented by the transmission network is found out. If the impedance thus obtained is lower than the permissible underimpedance $Z_{in}$, which can be checked via a second selector 29, also the second criterion for tripping is fulfilled. Tripping of the circuit breaker 4 can then be executed via an AND-element 30.

We claim:

1. A method for determining the relative distance "alpha" to the fault on a transmission line from a measuring station P located close to one of the ends of the transmission line, comprising the steps of:

forming a fault model of the transmission line from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation $U = \text{alpha} (Z_L I + Z_N I_N) + I_F R_F$;

inputting an assumption of a fault resistance $R_F$ and a fault current $I_F$ at the fault point from the measuring station P to the fault model;

supplying the impedance $Z_L$, the resistance $R_L$ and the inductance $L_L$ of the transmission line to the fault model;

continuously sampling the phase currents I and the phase voltages U of the transmission line;

feeding the fault current to the fault point from the other end of the transmission line; and determining the relative distance "alpha" in the fault model from the voltage balance equation.

2. A method for determining the relative distance "alpha" to the fault on a transmission line from a measuring station P located close to one of the ends of the transmission line according to claim 1, further comprising the steps of setting the sum of the measured current samples for each phase at two adjacent points in time and where the value of each current sample is multiplied by a respective coefficient chosen so that the fault current is in phase with the positive-sequence and negative-sequence current changes.

3. A method for determining the relative distance "alpha" to the fault on a transmission line from a measuring station P located close to one of the ends of the transmission line according to claim 1, further comprising the steps of forming the real part and the imaginary part of the measurement signals for each measurement sample and establishing two voltage balance equations:

$$U_r = \text{alpha}(R_L I_r + L_L dI_r/dt + R_N I_{Nr} + L_N dI_{Nr}/dt) + I_{Fr} R_F \text{ and}$$

$$U_i = \text{alpha}(R_L I_i + L_L dI_i/dt + R_N I_{Ni} + L_N dI_{Ni}/dt) + I_{Fi} R_F$$

where r indicates the respective real part and i indicates the respective imaginary part;

determining alpha as $(U_r I_{Fi} - U_i I_{Fr})/(U_{Hr} I_{Fr} = U_{Hr} \cdot I_{Fr})$ where $U_{Hr} = k_1 \cdot I_r + k_2 \cdot I_{Nr} + k_3 \cdot dI_r + k_4 \cdot dI_{Nr}$ and $U_{Hi} = k_1 \cdot I_i + k_2 \cdot I_{Ni} = k_3 \cdot dI_i + k_4 \cdot dI_{Ni}$ where the coefficients $k_1, k_2, k_3$ and $k_4$ are determined as follows:

$$K_1 = R_L; k_2 = R_N; k_3 = L_L/dt \text{ and } k_4 = L_N/dt.$$

4. A method for determining the relative distance "alpha" to the fault on a transmission line from a measuring station P located close to one of the ends of the transmission line, comprising the steps of:

forming a fault model of the transmission line from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation:

$$U = \text{alpha}(R_L I + L_L dI/dt + R_N I_N + L_N dI_N/dt) + I_F R_F;$$

inputting an assumption of a fault resistance $R_F$ and a fault current $I_F$ at the fault point from the measuring station P to the fault model;

supplying the impedance $Z_L$, the resistance $R_L$ and the inductance $L_L$ of the transmission line to the fault model;

continuously sampling the phase currents I and the phase voltages U of the transmission line;

feeding the fault current to the fault point from the other end of the transmission line; and determining the relative distance "alpha" in the fault model from the voltage balance equation.

5. A method for determining the relative distance "alpha" to the fault on a transmission line from a measuring station P located close to one of the ends of the transmission line according to claim 4, further comprising the steps of setting the sum of the measured current samples for each phase at two adjacent points in time and where the value of each current sample is multiplied by a respective coefficient chosen so that the fault current is in phase with the positive-sequence and negative-sequence current changes.

6. A method for determining the relative distance "alpha" to the fault on a transmission line from a measuring station P located close to one of the ends of the transmission line according to claim 4, further comprising the steps of forming the real part and the imaginary part of the measurement signals for each measurement sample and establishing two voltage balance equations:

$$U_r = \text{alpha}(R_L I_r + L_L dI_r/dt + R_N I_{Nr} + L_N dI_{Nr}/dt) + I_{Fr} R_F \text{ and}$$

$$U_i = \text{alpha}(R_L I_i + L_L dI_i/dt + R_N I_{Ni} + L_N dI_{Ni}/dt) + I_{Fi} R_F$$

where r indicates the respective real part and i indicates the respective imaginary part;

determining alpha as $(U_r I_{Fi} - U_i I_{Fr})/(U_{Hr} I_{Fr} - U_{Hr} \cdot I_{Fr})$ where $U_{Hr}=k_1 \cdot I_r+k_2 \cdot I_{Nr}+k_3 \cdot dI_r+k_4 \cdot dI_{Nr}$ and
$U_{Hi}=k_1 \cdot I_i+k_2 \cdot I_{Ni}=k_3 \cdot dI_i+k_4 \cdot dI_{Ni}$
where the coefficients $K_1$, $k_2$, $k_3$ and $k_4$ are determined as follows:

$$K_1=R_L;\ k_2=R_N;\ k_3=L_L/dt\ and\ k_4=L_N/dt.$$

7. A method for determining the relative distance "alpha" to the fault on a transmission line from a measuring station P located close to one of the ends of the transmission line, comprising the steps of:
forming a fault model of the transmission line from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation:

$$U=alpha(R_LI+X_L(I_1-I_0)/(\omega_0 dt)+R_NI_N+X_N(I_{N1}-I_{N0})/(\omega_0 dt))+I_FR_F$$

where $X_L$ is the line reactance at nominal frequency $\omega_0$ and $X_N$ is the zero-sequence reactance at the nominal frequency;
inputting an assumption of a fault resistance $R_F$ and a fault current $I_F$ at the fault point from the measuring station P to the fault model;
supplying the impedance $Z_L$, the resistance $R_L$ and the inductance $L_L$ of the transmission line to the fault model;
continuously sampling the phase currents I and the phase voltages U of the transmission line;
feeding the fault current to the fault point from the other end of the transmission line; and
determining the relative distance "alpha" in the fault model from the voltage balance equation.

8. A method for determining the relative distance "alpha" to the fault on a transmission line from a measuring station P located close to one of the ends of the transmission line according to claim 7, further comprising the steps of setting the sum of the measured current samples for each phase at two adjacent points in time and where the value of each current sample is multiplied by a respective coefficient chosen so that the fault current is in phase with the positive-sequence and negative-sequence current changes.

9. A method for determining the relative distance "alpha" to the fault on a transmission line from a measuring station P located close to one of the ends of the transmission line according to claim 7, further comprising the steps of forming the real part and the imaginary part of the measurement signals for each measurement sample and establishing two voltage balance equations:

$$U_r=alpha(R_LI_r+L_LdI_r/dt+R_NI_{Nr}+L_NdI_{Nr}/dt)+I_{Fr}R_F\ and$$

$$U_i=alpha(R_LI_i+L_LdI_i/dt+R_NI_{Ni}+L_NdI_{Ni}/dt)+I_{Fi}R_F$$

where r indicates the respective real part and i indicates the respective imaginary part;
determining alpha as $(U_r I_{Fi}-U_i I_{Fr})/(U_{Hr} I_{Fr}-U_{Hr} I_{Fr})$
where $U_{Hr}=k_1 I_r+k_2 I_{Nr}+k_3 dI_r+k_4 dI_{Nr}$ and
$U_{Hi}=k_1 I_i+k_2 I_{Ni}=k_3 dI_i+k_4 dI_{Ni}$
where the coefficients $k_1$, $k_2$, $k_3$ and $k_4$ are determined as follows:

$$K_1=R_L;\ k_2=R_N;\ k_3=L_L/dt\ and\ k_4=L_N/dt.$$

10. Apparatus for determining the relative distance "alpha" to the fault on a transmission line from a measuring station P located close to one of the ends of the transmission line, comprising:
a fault model of the transmission line formed from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation $U=$alpha$(Z_LI+Z_NI_N)+I_FR_F$;
said fault model receiving assumed values for the fault resistance $R_F$ and the fault current $I_F$ at the fault point from the measuring station P to the fault model;
said fault model also receiving the impedance $Z_L$, the resistance $R_L$ and the inductance $L_L$ of the transmission line;
a sampler circuit for continuously sampling the phase currents I and the phase voltages U of the transmission line;
said fault model determining the relative distance "alpha" from the voltage balance equation.

11. Apparatus for determining the relative distance "alpha" to the fault on a transmission line from a measuring station P located close to one of the ends of the transmission line according to claim 10, further comprising a circuit for setting the sum of the measured current samples for each phase at two adjacent points in time and where the value of each current sample is multiplied by a respective coefficient chosen so that the fault current is in phase with the positive-sequence and negative-sequence current changes.

12. A apparatus for determining the relative distance "alpha" to the fault on a transmission line from a measuring station P located close to one of the ends of the transmission line according to claim 10, further comprising a circuit for forming the real part and the imaginary part of the measurement signals for each measurement sample and establishing two voltage balance equations:

$$U_r=alpha(R_LI_r+L_LdI_r/dt+R_NI_{Nr}+L_NdI_{Nr}/dt)+I_{Fr}R_F\ and$$

$$U_i=alpha(R_LI_i+L_LdI_i/dt+R_NI_{Ni}+L_NdI_{Ni}/dt)+I_{Fi}R_F$$

where r indicates the respective real part and i indicates the respective imaginary part;
the fault model determining alpha as $(U_r I_{Fi}-U_i \cdot I_{Fr})/(U_{Hr}I_{Fr}-U_{Hr}I_{Fr})$ where $U_{Hr}=k_1 \cdot I_r+k_2 \cdot I_{Nr}+k_3 \cdot dI_r+k_4 \cdot dI_{Nr}$ and
$U_{Hi}=k_1 \cdot I_i+k_2 \cdot I_{Ni}=k_3 \cdot dI+k_4 \cdot dI_{Ni}$
where the coefficients $k_1$, $k_2$, $k_3$ and $k_4$ are determined as follows:

$$K_1=R_L;\ k_2=R_N;\ k_3=L_L/dt\ and\ k_4=L_N/dt.$$

13. Apparatus for determining the relative distance "alpha" to the fault on a transmission line from a measuring station P located close to one of the ends of the transmission line, comprising:

a fault model of the transmission line formed from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation:

$$U = alpha(R_L I + L_L dI/dt + R_N I_N + L_N dI_N/dt) + I_F R_F;$$

said fault model receiving the fault resistance $R_F$ and the fault current $I_F$ at the fault point from the measuring station P to the fault model;

said fault model also receiving the impedance $Z_L$, the resistance $R_L$ and the inductance $L_L$ of the transmission line;

a sampler circuit for continuously sampling the phase currents I and the phase voltages U of the transmission line; and said fault model determining the relative distance "alpha" from the voltage balance equation.

14. Apparatus for determining the relative distance "alpha" to the fault on a transmission line from a measuring station P located close to one of the ends of the transmission line according to claim 13, further comprising a circuit for setting the sum of the measured current samples for each phase at two adjacent points in time and where the value of each current sample is multiplied by a respective coefficient chosen so that the fault current is in phase with the positive-sequence and negative-sequence current changes.

15. A apparatus for determining the relative distance "alpha" to the fault on a transmission line from a measuring station P located close to one of the ends of the transmission line according to claim 13, further comprising the steps of forming the real part and the imaginary part of the measurement signals for each measurement sample and establishing two voltage balance equations:

$$U_r = alpha(R_L I_r + L_L dI_r/dt + R_N I_{Nr} + L_N dI_{Nr}/dt) + I_{Fr} R_F \text{ and}$$

$$U_i = alpha(R_L I_i + L_L dI_i/dt + R_N I_{Ni} + L_N dI_{Ni}/dt) + I_{Fi} R_F$$

where r indicates the respective real part and i indicates the respective imaginary part;

determining alpha as $(U_r I_{Fi} - U_i I_{Fr})/(U_{Hr} I_{Fr} - U_{Hr} \cdot I_{Fr})$ where $U_{Hr} = k_1 \cdot I_r + k_2 \cdot I_{Nr} + k_3 \cdot dI_r + k_4 \cdot dI_{Nr}$ and $U_{Hi} = k_1 \cdot I_i + k_2 \cdot I_{Ni} = k_3 \cdot dI_i + k_4 \cdot dI_{Ni}$ where the coefficients $k_1$, $k_2$, $k_3$ and $k_4$ are determined as follows: $k_1 = R_L$; $k_2 = R_N$; $k_3 = L_L/dt$ and $k_4 = L_N/dt$.

16. Apparatus for determining the relative distance "alpha" to the fault on a transmission line from a measuring station P located close to one of the ends of the transmission line, comprising:

a fault model of the transmission line formed from the zero-sequence impedance $Z_N$, the zero-sequence resistance $R_N$ and the zero-sequence inductance $L_N$ of the transmission line and the corresponding transformed zero-sequence current $I_N$ and operating with the voltage balance equation:

$$U = alpha(R_L I + X_L(I_1 - I_0)/(\omega_0 dt) + R_N I_N + X_N(I_{N1} - I_{N0})/(\omega_0 dt)) + I_F R_F$$

where $X_L$ is the line reactance at nominal frequency $\omega_0$ and $X_N$ is the zero-sequence reactance at the nominal frequency;

a fault current $I_F$ at the fault point from the measuring station P;

said fault model also receiving the impedance $Z_L$, the resistance $R_L$ and the inductance $L_L$ of the transmission line;

a sampler circuit for continuously sampling the phase currents I and the phase voltages U of the transmission line;

said fault model determining the relative distance "alpha" from the voltage balance equation.

17. A apparatus for determining the relative distance "alpha" to the fault on a transmission line from a measuring station P located close to one of the ends of the transmission line according to claim 16, further comprising a circuit for setting the sum of the measured current samples for each phase at two adjacent points in time and where the value of each current sample is multiplied by a respective coefficient chosen so that the fault current is in phase with the positive-sequence and negative-sequence current changes.

18. Apparatus for determining the relative distance "alpha" to the fault on a transmission line from a measuring station P located close to one of the ends of the transmission line according to claim 16, further comprising a circuit for forming the real part and the imaginary part of the measurement signals for each measurement sample and establishing two voltage balance equations:

$$U_r = alpha(R_L I_r + L_L dI_r/dt + R_N I_{Nr} + L_N dI_{Nr}/dt) + I_{Fr} R_F \text{ and}$$

$$U_i = alpha(R_L I_i + L_L dI_i/dt + R_N I_{Ni} + L_N dI_{Ni}/dt) + I_{Fi} R_F$$

where r indicates the respective real part and i indicates the respective imaginary part;

said fault model determining alpha as $(U_r I_{Fi} - U_i I_{Fr})/(U_{Hr} I_{Fr} - U_{Hr} I_{Fr})$ where $U_{Hr} = k_1 I_r + k_2 I_{Nr} + k_3 dI_r + k_4 dI_{Nr}$ and $U_{Hi} + k_1 I_i + k_2 I_{Ni} + k_3 dI_i + k_4 dI_{Ni}$ where the coefficients $k_1$, $k_2$, $k_3$ and $k_4$ are determined as follows:

$$K_1 = R_L;\ k_2 = R_N;\ k_3 = L_L/dt \text{ and } k_4 = L_N/dt.$$

* * * * *